US009819298B2

(12) United States Patent
Aldinger et al.

(10) Patent No.: US 9,819,298 B2
(45) Date of Patent: Nov. 14, 2017

(54) CIRCUIT ARRANGEMENT AND OPERATING METHOD

(71) Applicant: Robert Bosch GmbH, Stuttgart (DE)

(72) Inventors: Stefan Aldinger, Bad Wimpfen (DE); Stefan Butzmann, Schalksmühle (DE); Tobias Richter, Esslingen (DE)

(73) Assignee: Robert Bosch GmbH, Stuttgart (DE)

( * ) Notice: Subject to any disclaimer, the term of this patent is extended or adjusted under 35 U.S.C. 154(b) by 21 days.

(21) Appl. No.: 14/557,780

(22) Filed: Dec. 2, 2014

(65) Prior Publication Data
US 2015/0155817 A1    Jun. 4, 2015

(30) Foreign Application Priority Data

Dec. 4, 2013   (DE) .................. 10 2013 224 800

(51) Int. Cl.
| H02P 6/14 | (2016.01) |
| H02J 7/00 | (2006.01) |
| H02P 27/06 | (2006.01) |
| H02M 7/537 | (2006.01) |
| H03K 17/18 | (2006.01) |
| H02H 3/16 | (2006.01) |
| H02M 1/08 | (2006.01) |

(52) U.S. Cl.
CPC .............. *H02P 27/06* (2013.01); *H02M 7/537* (2013.01); *H03K 17/18* (2013.01); *H02H 3/16* (2013.01); *H02M 1/08* (2013.01); *H03K 2217/0063* (2013.01); *H03K 2217/0072* (2013.01)

(58) Field of Classification Search
CPC ........ H02P 27/06; H02M 7/537; H03K 17/18; H02H 3/16
USPC ............. 318/400.27, 400.26, 400.01, 400.22
See application file for complete search history.

(56) References Cited

U.S. PATENT DOCUMENTS

| 2006/0050455 | A1 | 3/2006 | Sumida et al. | |
| 2011/0234176 | A1* | 9/2011 | Nakamura | H02M 1/08 320/166 |
| 2014/0084828 | A1* | 3/2014 | Yamamoto | H02M 1/32 318/400.22 |
| 2014/0334214 | A1* | 11/2014 | Katoh | H02M 7/53803 363/132 |

FOREIGN PATENT DOCUMENTS

| JP | H11356035 | 12/1999 |
| JP | 2001238432 | 8/2001 |

\* cited by examiner

*Primary Examiner* — Bentsu Ro
*Assistant Examiner* — Zemenay Truneh
(74) *Attorney, Agent, or Firm* — Michael Best & Friedrich LLP

(57) ABSTRACT

A circuit arrangement (1) for operating an electric machine. The circuit arrangement (1) includes at least one high-voltage half-bridge circuit (2), which has a high-side semiconductor switch (3) and a low-side semiconductor switch (4). In each case one gate driver (5, 6) is assigned to the semiconductor switches (3, 4) for actuating said semiconductor switches, and includes a low-voltage controller (7), which actuates the gate drivers (5, 6). A high-voltage controller (11) senses output signals (AS) of the gate drivers (5, 6) and transmits at least the sensed output signals (AS) to the low-voltage controller (7) using a data bus (12).

8 Claims, 1 Drawing Sheet

CIRCUIT ARRANGEMENT AND OPERATING METHOD

BACKGROUND OF THE INVENTION

The invention relates to a circuit arrangement for operating an electric machine, comprising at least one high-voltage half-bridge circuit, which has a high-side semiconductor switch and a low-side semiconductor switch, wherein in each case one gate driver is assigned to the semiconductor switches for actuating said semiconductor switches, and comprising a low-voltage controller, which actuates the gate drivers.

In addition, the invention relates to a method for operating such a circuit arrangement.

Electric machines, in particular polyphase electric machines, are generally operated by an inverter, which is controlled by a microcontroller. The microcontroller is in this case arranged on the low-voltage side of the inverter, while at least one semiconductor bridge circuit is assigned to a high-voltage grid. This is known, for example, in hybrid vehicles which have a vehicle electrical distribution system with a low voltage and a drive system grid with a high voltage. The inverters generally have a plurality of half-bridge circuits, which each have two semiconductor switches, a high-side semiconductor switch and a low-side semiconductor switch which are connected in series with one another and are each actuated by a gate driver, which receives and implements control signals from the microcontroller. Output signals of the gate drivers need to be read back by the controlling microcontroller for monitoring purposes in order to ensure safe operation of the circuit arrangement or of the electric machine. Generally, in this case each actuation signal of a power switch or each output signal of a gate driver is passed separately via an insulation barrier between the high-voltage part and the low-voltage part.

SUMMARY OF THE INVENTION

The circuit arrangement according to the invention has the advantage that output signals of the semiconductor switches no longer need to be fed back separately via the insulation barrier. In particular, owing to the invention, the number of lines overcoming the insulation barrier is reduced by virtue of the output signals being collected and transmitted jointly by an interface. In accordance with the invention, provision is made in this regard for a high-voltage controller to be provided which senses output signals of the gate drivers and is connected to the low-voltage controller by a data bus. The high-voltage controller at least transmits the collected output signals to the low-voltage controller via this data bus, which low-voltage controller can thus read back said output signals and evaluate them. By collection of the output signals by means of the high-voltage controller and transmitting said output signals, for example in the form of a data packet via the data bus, now only the data bus is necessary as interface between the high-voltage side and the low-voltage side in order to make it possible for the output signals of the gate drivers to be read back by the low-voltage controller. Therefore, provision is made in accordance with the invention for the high-voltage controller to transmit at least the sensed output signals to the low-voltage controller by means of the data bus. In addition to the output signals, other values of the gate drivers or the half-bridge circuit can also be sensed and evaluated by the low-voltage controller or the high-voltage controller.

Preferably, the low-voltage controller transmits a synchronization signal to the high-voltage controller by means of the data bus, with the result that the two controllers operate with the same clock frequency and assignment of the data packets transmitted by the high-voltage controller, with respect to the sensed output signals, to the actuation signals generated by the low-voltage controller is ensured. This ensures that the data transmission on the data bus has a fixed temporal relationship with the generation of the gate driver states or with the actuation of the gate drivers. The bus speed of the data bus in this case does not necessarily need to be above the clock-pulse rate with which the gate driver states are generated. It only needs to be so high that the time span between the end of transmission of a synchronization signal and the application of the output signal or gate driver state to be read back can be determined with sufficient precision and is in particular constant.

Furthermore, provision is preferably made for the circuit arrangement to have a plurality of half-bridge circuits, where in each case one gate driver is assigned to each semiconductor switch. In particular, provision is made for the half-bridge circuits to be connected to one another to form a full-bridge, in particular a B6 bridge circuit. Preferably, the circuit arrangement forms an inverter for the electric machine. In this case, preferably a semiconductor switching bridge arrangement is provided for each phase of an electric machine.

Particularly preferably, provision is made for the circuit arrangement to only have one high-voltage controller, in particular a microcontroller. This is also provided when the circuit arrangement comprises a plurality of half-bridge circuits. The output signals of the respective gate drivers are expediently supplied to one high-voltage controller, which senses said output signals and transmits them back via the data bus to the low-voltage controller for evaluation and monitoring.

The method according to the invention is characterized by the fact that a high-voltage controller is provided, which senses output signals of the gate drivers and transmits these output signals to the low-voltage controller using a data bus. The low-voltage controller evaluates the data sent back for monitoring and checking of the operation of the electric machine or of the circuit arrangement and of the low-voltage controller. This results in the advantages already mentioned above.

Furthermore, provision is preferably made for the low-voltage controller to generate a synchronization signal and to transmit it by means of the data bus to the high-voltage controller in order to ensure that firstly that the two controllers operate with the same clock and secondly that the data transmission takes place on the data bus with a fixed temporal relationship with respect to the generation of the gate driver states or with respect to the actuation of the gate drivers.

As a result, assignment of the read-back output signals to the actuation signals of the low-voltage controller can be ensured.

BRIEF DESCRIPTION OF THE DRAWINGS

The invention will be explained in more detail below with reference to an exemplary embodiment. In this regard.

DETAILED DESCRIPTION

Figure 1:
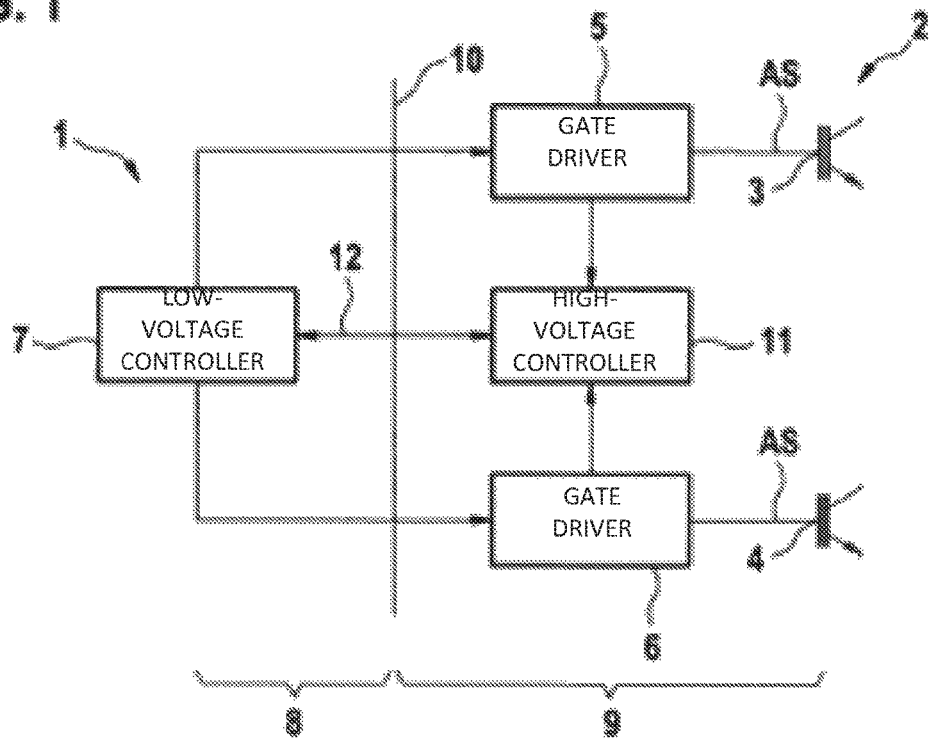
FIG. 1 shows a circuit arrangement in a simplified block circuit diagram.

FIG. 1 shows a circuit arrangement 1 in a simplified block circuit diagram. The circuit arrangement 1 has a half-bridge circuit 2, which has two semiconductor switches 3 and 4. The semiconductor switches 3, 4 are preferably identical. In this case, a gate driver 5, 6 is assigned to each of the semiconductor switches 3, 4 and actuates the respective semiconductor switch 3, 4. The semiconductor switch 3 is expediently a so-called high-side semiconductor switch and the semiconductor switch 4 is expediently a so-called low-side semiconductor switch. Correspondingly, the gate drivers 5 and 6 are in the form of high-side and low-side gate drivers 5, 6, respectively.

The two gate drivers 5, 6 are actuated directly by a controller 7, which in this case is in the form of a microcontroller. The controller 7 is in this case arranged in a low-voltage part 8, while the gate drivers 5, 6 and the semiconductor switches 3, 4 or the half-bridge circuit 2 are positioned in a high-voltage part 9 of the circuit arrangement 1. The controller 7 is therefore a low-voltage controller, which is incorporated in a low-voltage vehicle electrical distribution system of a motor vehicle, for example. The half-bridge circuit 2 is assigned to the high-voltage grid, in which, for example, electrical drive components of the motor vehicle, such as in particular an electric machine, are provided. Potential isolation 10 is required between the low-voltage part 8 and the high-voltage part 9 in order to ensure safe operation of the circuit arrangement 1 or of the driver apparatus formed thereby.

As is conventional, provision is made for the controller 7 to read back output signals AS of the gate drivers 5, 6 which are used for actuating the semiconductor switches 3, 4 in order to monitor the operation of the circuit arrangement 1. In this case, provision is made for a further controller 11 to be arranged on the high-voltage side, which controller 11 is in the form of a high-voltage microcontroller. The controller 11 is in this case connected to the two gate drivers 5, 6 in order to sense the status of the respective gate driver 5, 6 and in particular the respective output signals AS.

The controller 11 is in this case connected to the controller 7 by a data bus 12. The controllers 7 and 11 therefore communicate with one another via the data bus 12. In this case, the controller 11 transmits at least the sensed output signals AS to the microcontroller 7 by the data bus 12 with the result that the controller 7 can compare the output signals AS with the actuation signals and can monitor or monitors the operation of the circuit arrangement 1 or of the drive device. Therefore, the output signals AS of the gate drivers 5, 6 are combined in a data bus, so that individual transmission channels between the high-voltage part 9 and the low-voltage part 8, which were previously conventional, can be dispensed with. Expediently, the circuit arrangement 1 has a plurality of semiconductor bridges 2 in order to form, for example, a full-bridge, in particular a B6 bridge, for operating a three-phase electric machine. In this case, only one microcontroller or controller 11, to which the output signals of all of the gate drivers are supplied, is also provided. The controller 11 combines these output signals and transmits them back to the controller 11 via the data bus 12. In addition to data interchange, the data bus 12 is also used for time synchronization of the two controllers 7, 11 with respect to one another.

The gate driver states are output by the low-voltage controller 7 with a fixed pattern, for example via the separate data lines illustrated in FIG. 1. Every n-th time when a gate driver state has been generated by the controller 7, i.e. a gate driver 5, 6 has been actuated, in addition a synchronization data packet or signal is sent by the controller 7 via the data bus 12 to the controller 11, which synchronization data packet instructs the controller 11 to read back the respective next data packet from the output of the gate driver 5 or 6 and to send it back to the low-voltage controller 7 via the data bus.

It is advantageous for this that the data transmission on the data bus 12 on the part of the low-voltage controller 7 has a fixed temporal relationship with respect to the generation of the gate driver states or the actuation of the gate drivers 5, 6. The bus speed of the data bus 12 therefore does not necessarily need to be above the clock-pulse rate at which the gate driver states are generated by the controller 7. It only needs to be so high that the time span between the end of transmission of the synchronization packet or of the synchronization signal and the application of the gate driver state to be read back or of the output signal AS can be determined sufficiently accurately and is constant.

Figure 2:
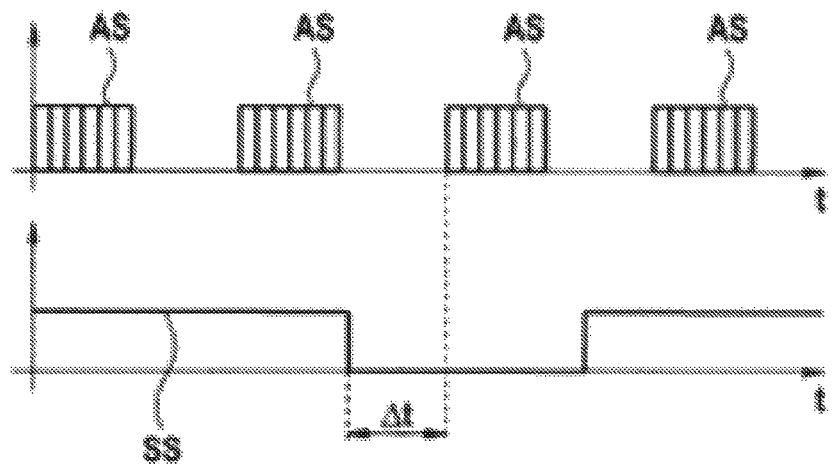
FIG. 2 shows a signal profile of a data bus of the circuit arrangement.

FIG. 2 shows, in this regard, plotted on a graph, the operation of the data bus 12 in a simplified illustration. In this case, firstly the output signals AS of one of the gate drivers 5 or 6 are plotted over time t. Beneath this, the synchronization signal SS generated by the controller 7 is plotted which is selected such that the time span Δt between the end of transmission of the synchronization signal SS and the temporally following output signal AS is determined with sufficient accuracy and in particular is constant. The output signal AS following the synchronization signal is read back and, as described previously, transmitted to the controller 7 by the data bus 12. The read-back output signal or the read-back gate driver state needs to be stored after generation by the controller 7 until the back-transmission and the subsequent comparison are complete. In the following step, the data bus can also be used for transmitting other data which have nothing to do with the synchronization or the reading back of the output signals. Another use of the data bus 12 can therefore be provided between two read-back operations.

The invention claimed is:

1. A circuit arrangement (1) for operating an electric machine, comprising:
    at least one high-voltage half-bridge circuit (2) having a high-side semiconductor switch (3) and a low-side semiconductor switch (4), a gate driver (5, 6) is assigned to each of the semiconductor switches (3, 4) for actuating said semiconductor switches;
    a low-voltage controller (7), which actuates the gate drivers (5, 6); and
    a high-voltage controller (11) which senses output signals (AS) of the gate drivers (5, 6) and transmits at least the sensed output signals (AS) to the low-voltage controller (7) using a data bus (12);
    wherein the sensed output signals (AS) are between the gate drivers (5, 6) and gates of the high-side semiconductor switch (3) and the low-side semiconductor switch (4).

2. The circuit arrangement according to claim 1, characterized in that the low-voltage controller (7) transmits a synchronization signal to the high-voltage controller (11).

3. The circuit arrangement according to claim 2, wherein the transmission of the synchronization signal to the high-voltage controller (11) occurs regularly.

4. The circuit arrangement according to claim 1, characterized in that the circuit arrangement (1) has a plurality of half-bridge circuits (2), wherein in each case one gate driver (5, 6) is assigned to each semiconductor switch (3, 4).

5. The circuit arrangement according to claim 1, characterized in that the circuit arrangement (1) has only one high-voltage controller (11).

6. The circuit arrangement according to claim 5, wherein the high-voltage controller (11) is a microcontroller.

7. A method for operating a circuit arrangement (1) having at least one high-voltage half-bridge circuit (2), which has a high-side semiconductor switch (3) and a low-side semiconductor switch (4), wherein in each case one gate driver (5, 6) is assigned to the semiconductor switches (3, 4) for actuation thereof, and comprising a low-voltage controller (7), which actuates the gate drivers (5, 6), the method comprising:

a high-voltage controller (11) sensing output signals (AS) of the gate drivers (5, 6); and transmitting at least these output signals to the low-voltage controller (7) using a data bus (12);

wherein the sensed output signals (AS) are between the gate drivers (5, 6) and gates of the high-side semiconductor switch (3) and the low-side semiconductor switch (4).

8. The method according to claim 7 characterized in that the low-voltage controller (7) generates a synchronization signal (SS) and transmits it to the high-voltage controller (11) using the data bus (12).

\* \* \* \* \*